United States Patent
Feng et al.

(10) Patent No.: US 7,994,876 B2
(45) Date of Patent: Aug. 9, 2011

(54) LIGHTWEIGHT ELECTROMAGNETIC INTERFERENCE FILTER

(75) Inventors: Frank Z. Feng, Loves Park, IL (US); Dwight D. Schmitt, Rockford, IL (US); Donal E. Baker, Rockford, IL (US); John Huss, Roscoe, IL (US); Curtis B. White, Rockford, IL (US); Jamal Shafii, Loves Park, IL (US); Mark F. Stunkel, Palatine, IL (US)

(73) Assignee: Hamilton Sundstrand Corporation, Rockford, IL (US)

( * ) Notice: Subject to any disclaimer, the term of this patent is extended or adjusted under 35 U.S.C. 154(b) by 305 days.

(21) Appl. No.: 12/220,279

(22) Filed: Jul. 23, 2008

(65) Prior Publication Data

US 2010/0019862 A1 Jan. 28, 2010

(51) Int. Cl.
*H03H 7/06* (2006.01)

(52) U.S. Cl. .................. 333/181; 333/172; 333/177

(58) Field of Classification Search .......... 333/126–129, 333/132, 134, 181, 172, 177
See application file for complete search history.

(56) References Cited

U.S. PATENT DOCUMENTS

| | | | |
|---|---|---|---|
| 4,263,549 A | | 4/1981 | Toppeto |
| 5,307,035 A | * | 4/1994 | Dufilie et al. ............. 333/193 |
| 5,321,373 A | | 6/1994 | Shusterman et al. |
| 5,966,064 A | * | 10/1999 | Yoshizawa et al. ......... 336/221 |
| 6,075,425 A | * | 6/2000 | Gopfrich et al. ........... 333/181 |

FOREIGN PATENT DOCUMENTS

| | | |
|---|---|---|
| CH | 696920 A5 | 1/2008 |
| WO | WO2009013996 A | 1/2009 |

OTHER PUBLICATIONS

West, "Common Mode Inductors for EMI Filters Require Careful Attention to Core Material Selection", PCIM Magazine, Jul. 1995.
Mohan, et al., "A Novel Topology of EMI Filter to Suppress Common Mode and Differential Mode Noises of Electro Magnetic Interference in Switching Power Supplies", ARPN Journal of Engineering and Applied Sciences, Aug. 2007, pp. 32-35, vol. 2, No. 4.
Choochuan C, "A survey of output filter topologies to minimize the impact of PWM inverter waveforms on three-phase AC induction motors," 7th International Power Engineering Conference (IPEC), Nov. 29-Dec. 2, 2005, pp. 1-544, XPO31386048, figures 12,20,21.
Waeckerle T et al., "Strong volume reduction of common mode choke for RFI filters with help of nanocrystalline cores design and experiments," Journal of Magnetism and Magnetic Materials, vol. 304, No. 2, Sep. 2006, pp. e847-e849, XP024984886, abstract.
European Search Report in counterpart foreign application No. EP 09251858.8 filed Jul. 23, 2009.

* cited by examiner

*Primary Examiner* — Robert Pascal
*Assistant Examiner* — Kimberly E Glenn
(74) *Attorney, Agent, or Firm* — Kinney & Lange, P.A.

(57) ABSTRACT

A low pass filter includes a differential mode filter and a common mode filter. The common mode portion of the filter includes at least one inductor and one capacitor, as well as a damping circuit with at least one capacitor. The low pass filter has a reduced weight, which is useful in circumstances in which weight is a significant factor, such as in aircraft.

17 Claims, 3 Drawing Sheets

LIGHTWEIGHT ELECTROMAGNETIC INTERFERENCE FILTER

BACKGROUND

This invention relates generally to circuits for filtering electromagnetic noise. More specifically, the invention relates to a low pass filter with reduced weight for use in aircraft.

Electromagnetic interference, or "noise," is a common problem in electrical circuit design. Noise may originate from natural sources, such as background radiation or lightning strikes, but the more common and more problematic noise is electromagnetic noise generated by components in electrical systems. Modern aircraft include numerous electrical systems, so filtering of electromagnetic noise is a significant concern.

Filtering circuits are used to reduce the effect of electromagnetic noise in the electrical systems of aircraft. Electromagnetic noise signals are high frequency signals, so filtering circuits are usually designed as low pass filters, which allow the desirable low frequency signals to pass through a circuit, while filtering out the undesirable high frequency electromagnetic noise signals. Because the weight of components is of critical importance in aircraft design, it is beneficial to reduce the weight of components that are used in electrical circuits, including filtering circuits.

Therefore, there is a need in the art for an electrical filtering circuit that is able to provide sufficient filtering of electromagnetic noise in electrical circuits used in aircraft, while reducing the size and weight of the filtering circuit in order to optimize its use in aircraft electronics.

SUMMARY OF THE INVENTION

The invention is a low pass filter that replaces inductors with capacitors in the damping portion of the circuit. The resulting low pass filter significantly reduces the size and weight of the circuit, making it particularly useful in applications in which size and weight are important parameters, such as aircraft.

DETAILED DESCRIPTION

Figure 1A:
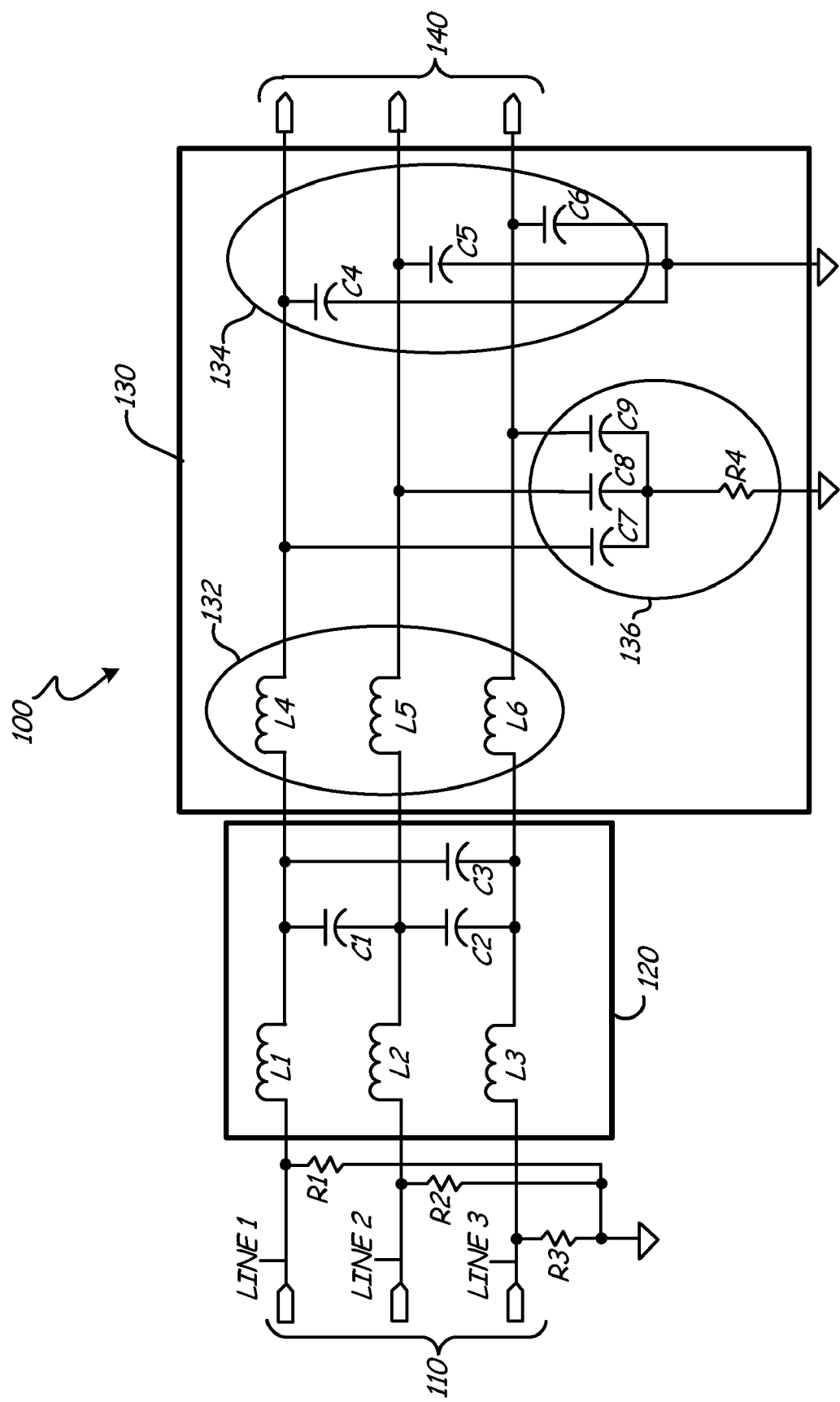
FIG. 1A is a schematic diagram showing a low pass filter circuit according to an embodiment of the invention.

FIG. 1A is a schematic diagram that shows low pass filter circuit 100 according to an embodiment of the invention. Low pass filter circuit 100 includes three inputs 110, pull-down resistors R1, R2 and R3, differential mode filter 120, common mode filter 130 and three outputs 140. There are three signal lines (or "rails") in low pass filter circuit 100, identified in FIG. 1 as line 1, line 2 and line 3. Low pass filter circuit 100 filters out electromagnetic noise in electrical circuits, particularly noise affecting electrical circuits in aircraft.

Electromagnetic noise includes two components: differential mode noise and common mode noise. Differential mode noise results from current flowing from a positive voltage terminal, through a load and returning through a negative voltage terminal. Common mode noise results from current flowing from a lead, through a load and returning through the ground terminal. Noise filtering circuits must eliminate both common mode noise and differential mode noise. The invention relates particularly to filtering common mode noise signals.

Electromagnetic noise enters circuit 100 at inputs 110. While electromagnetic noise generally consists of high frequency signals, these signals may also include a direct current component. Resistors R1, R2 and R3 are pull-down resistors to control common mode transient signals. Transients are high voltage bursts that may be caused by, for example, starting or switching of large electrical motors. The resistors R1, R2 and R3 provide a low resistance path to ground to filter out the direct current component of the electromagnetic noise. In this way, the system is able to start with minimal overshoot.

Differential mode filter 120 includes inductor L1, inductor L2, inductor L3, capacitor C1, capacitor C2 and capacitor C3. Inductor L1, inductor L2 and inductor L3 are positioned in line 1, line 2 and line 3, respectively. Capacitor C1 is positioned between line 1 and line 2, capacitor C2 is positioned between line 2 and line 3, and capacitor C3 is positioned between line 1 and line 3. Differential mode filter 120 works as a conventional differential mode filter, in which inductor L1, inductor L2 and inductor L3, capacitor C1, capacitor C2 and capacitor C3 work together to filter out differential mode noise signals.

Figure 1B:
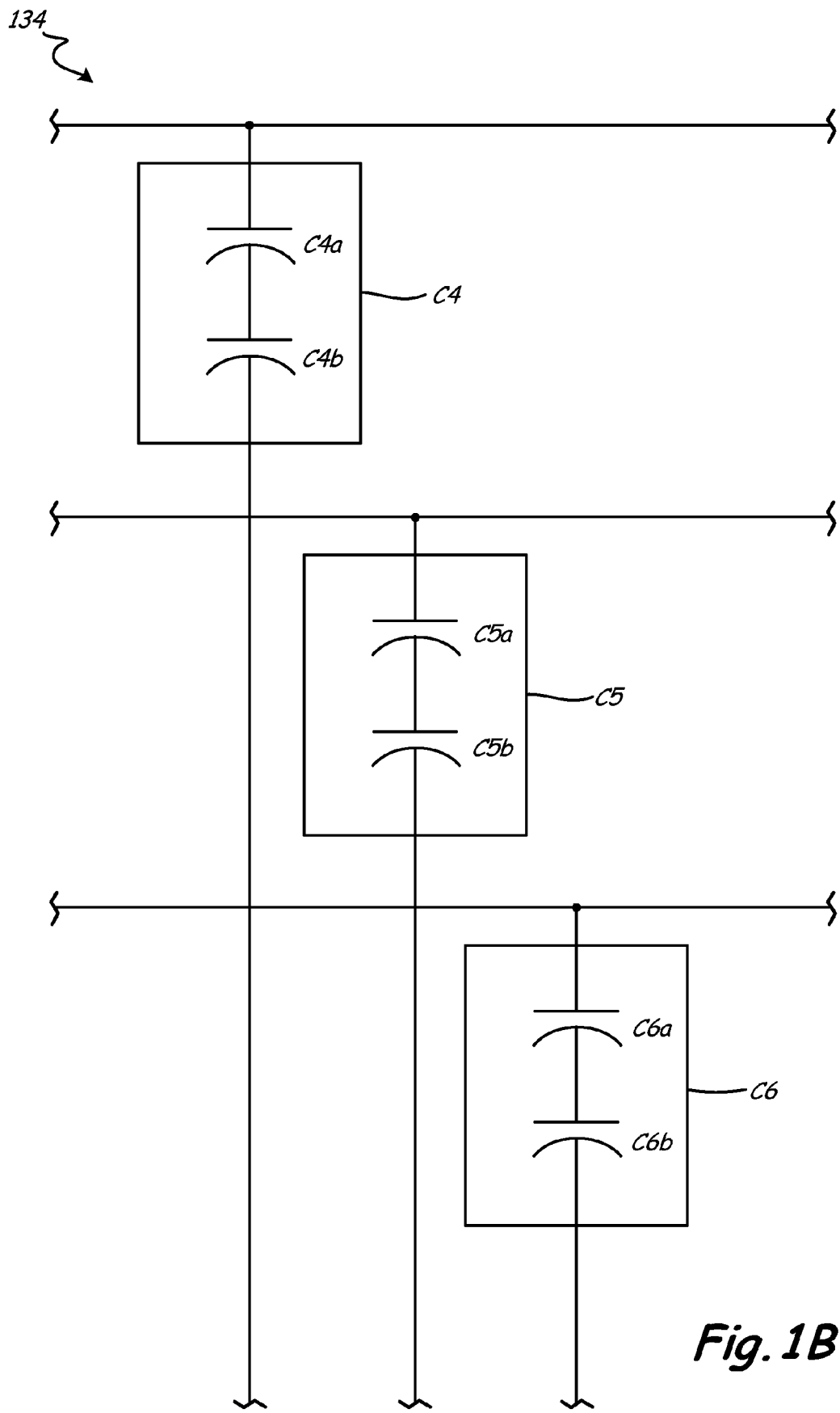
FIG. 1B is a schematic diagram showing a configuration of capacitors for a common mode filter according to an embodiment of the invention.

Common mode filter 130 includes inductors 132 (including inductor L4, inductor L5 and inductor L6), capacitors 134 (including capacitor C4, capacitor C5 and capacitor C6) and damping circuit 136 (including capacitor C7, capacitor C8, capacitor C9 and resistor R4). Inductors 132 are connected in each of the three signal lines: inductor L4 is connected in line 1, inductor L5 is connected in line 2 and inductor L6 is connected in line 3. Capacitors 134 are connected between the signal lines and ground: capacitor C4 is connected between line 1 and ground, capacitor C5 is connected between line 2 and ground and capacitor C6 is connected between line 3 and ground. For ease of explanation, capacitors capacitor C4, capacitor C5 and capacitor C6 are shown and discussed as individual capacitors. In some embodiments, each of these capacitors may be constructed by connecting two or more capacitors together. This is illustrated in FIG. 1B, which shows capacitor C4 consisting of capacitors C4a and C4b, capacitor C5 consisting of capacitors C5a and C5b, and capacitor C6 consisting of capacitors C6a and C6b.

Electromagnetic noise, whether it is differential mode noise or common mode noise, is composed of high frequency signals. An inductor's impedance is directly proportional to frequency, while a capacitor's impedance is inversely proportional to frequency. Thus, inductors present relatively high impedance to high frequency noise signals, while capacitors present relatively low impedance to high frequency noise signals. Therefore, inductors 132 present high impedance to high frequency signals, blocking these high frequency signals and thereby filtering out a significant portion of the high frequency noise signals which are sought to be eliminated. In addition, capacitors 134 present low impedance to high frequency noise signals. Any high frequency noise signals that get through inductors 132 will find that capacitors 134 present an extremely low impedance path to ground. The high frequency signals that are not filtered out by inductors 132 will be shunted to ground by capacitors 134. Therefore, high frequency signals are prevented from reaching output 140.

Damping circuit 136, which is part of common mode filter 130, includes capacitor C7, capacitor C8, capacitor C9 and resistor R4. The combination of inductors 132 and capacitors 134 have a certain resonant frequency that will depend upon the particular inductance and capacitance of all of those components. If the electromagnetic noise is at that particular resonant frequency, inductors 132 and capacitors 134 may enter a resonant state, which can lead to overheating and eventual failure of the circuit. Damping circuit 136 prevents low pass filter circuit 100 from entering a resonant state.

In one embodiment of the invention, common mode filter 130 is designed as a low pass filter that filters out noise signals at 150 kiloHertz (kHz) and above. In this embodiment of the invention, inductor 132 of common mode filter 130 is made up of 5400 microHenry (µH) nanocrystalline common mode inductors, capacitor C4, capacitor C5 and capacitor C6 are each two 47 nanoFarad (nF) common mode capacitors, capacitor C7, capacitor C8 and capacitor C9 are each single one microFarad (µF) capacitors, and resistor R4 is a 100 Ohm (Ω) resistor. In this configuration, common mode filter 130 exhibits essentially no impedance to signals of 1450 Hertz (Hz) and lower, while filtering out essentially all signals of 150 kiloHertz (kHz) and higher.

Figure 2:
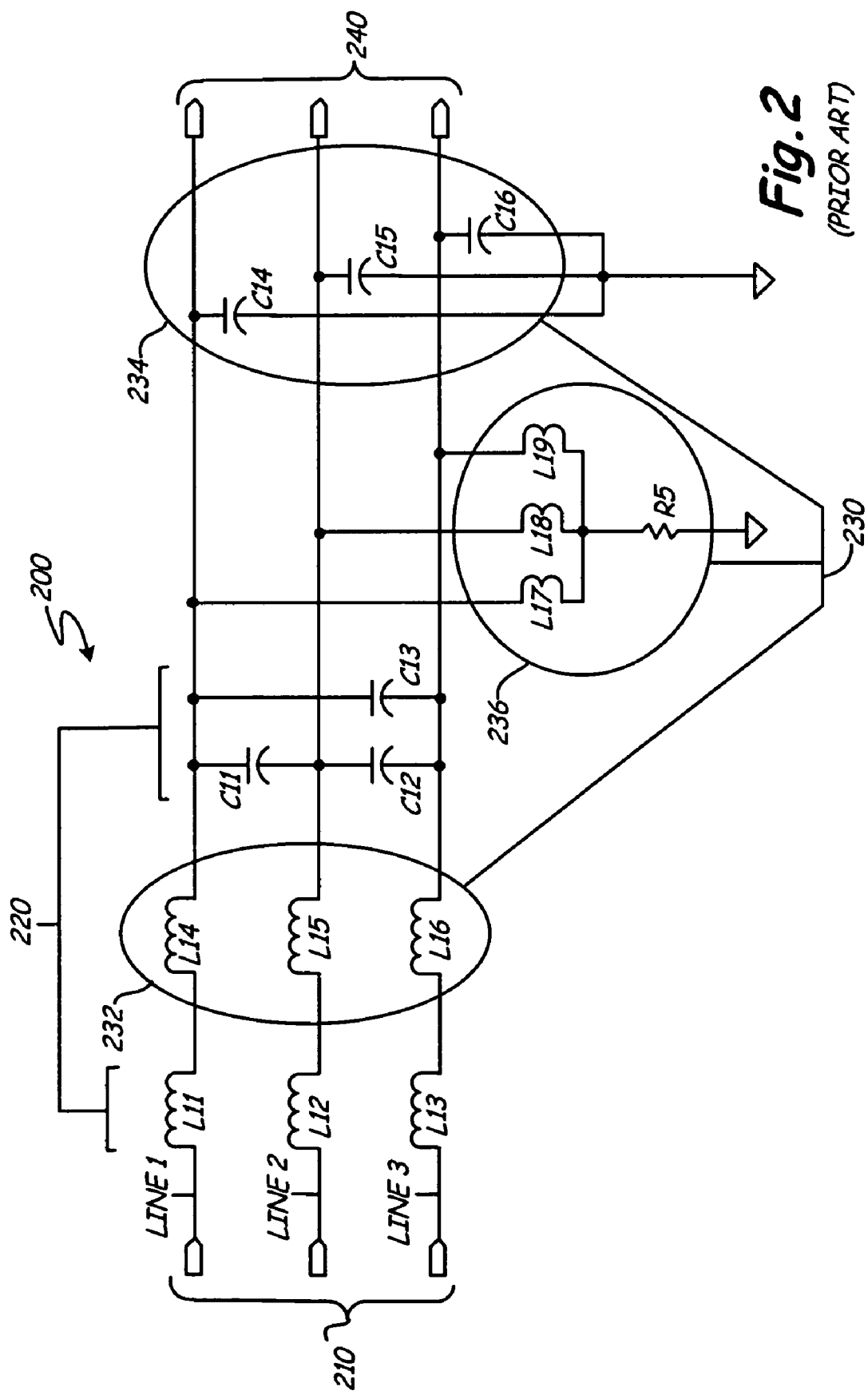
FIG. 2 is a schematic diagram showing a low pass filter according to the prior art.

For purposes of comparison, FIG. 2 shows a prior art low pass filter circuit 200, which includes inputs 210, differential mode filter 220 and common mode filter 230. Differential mode filter 220 includes inductor L11, inductor L12, inductor L13, capacitor C11, capacitor C12, and capacitor C13. Differential mode filter 120 in low pass filter circuit 100 and differential mode filter 220 in low pass filter circuit 200 function in essentially the same way.

Low pass filter circuit 200 also includes common mode filter 230, which includes inductors 232 (including inductor L14, inductor L15 and inductor L16), capacitors 234 (including capacitor C14, capacitor C15 and capacitor C16) and damping circuit 236 (including inductor L17, inductor L18, inductor L19 and resistor R4). In this particular prior art circuit, the inductors 232 are 500 microHenry (µH) common mode inductors, capacitors 234 are fifteen 1 microFarad (µF) common mode capacitors (i.e., capacitors C14, C15 and C16 are each five 1 microfarad (µF) common mode capacitors) and damping circuit 236 has three 100 milliHenry (mH) inductors and a 6 Ohm (Ω) resistor.

Comparing inductors 132 of circuit 100 with inductors 232 of circuit 200, the invention embodied in circuit 100 includes inductors with higher inductance. The performance of low pass filter 130 is proportional to the product of the inductance of inductors 132 and the capacitance of capacitors 134. Increasing the inductance of inductors 132 over the prior art allows the capacitance of capacitors 134 to be reduced over the prior art. As a result, circuit 100 only uses six capacitors for capacitors 134, in comparison to the fifteen capacitors used as capacitors 234 in circuit 200. This reduces the size and weight of circuit 100 by reducing the number of capacitors and the space needed for them in the circuit.

Similarly, comparing damping circuit 136 of circuit 100 with damping circuit 236 of circuit 200, the invention embodied in circuit 100 includes capacitors instead of inductors in the damping circuit. Damping circuit 236 in FIG. 2 includes three inductors and a resistor. When starting large motors during zero and low speeds, or at transient fault conditions, inductors L17, L18 and L19 of damping circuit 236 are subjected to DC and low frequency voltages. At such frequencies, inductors L17, L18 and L19 exhibit low impedance, leading to high current flow in damping circuit 236 to a point of possible destruction of damping circuit 236. By contrast, damping circuit 136 has high impedance to DC and low frequency voltages during low speed motor starting, or at transient fault conditions, which renders damping circuit 136 immune to destruction due to long low speed starting and fault situations.

In addition, as a result of replacing the inductors of damping circuit 236 with capacitors in damping circuit 136, the weight of low pass filter 100 is significantly lower than the weight of low pass filter 200. For example, in a comparison of circuits designed according to one embodiment of the invention and the prior art, the inductors in damping circuit 236 weighed about 2 pounds (0.9 kilograms), while the capacitors used in damping circuit 136 weighed about 0.2 pounds (0.09 kilograms). Because weight is a significant factor in aerospace and other applications, low pass filter 100 presents significant advantages over the prior art.

The invention is a low pass filter that filters EMI noise. The low pass filter includes a damping circuit that employs three capacitors and a resistor. Using capacitors in the damping circuit significantly reduces the overall weight of the low pass filter circuit, which presents significant advantages in certain applications, such as aerospace.

Although the present invention has been described with reference to preferred embodiments, workers skilled in the art will recognize that changes may be made in form and detail without departing from the spirit and scope of the invention.

The invention claimed is:

1. A low pass filter comprising:
   at least one pulldown resistor connected to a reference voltage;
   a differential mode filter; and
   a common mode filter connected in series with the differential mode filter, the common mode filter comprising:
      at least one inductor;
      at least one capacitor directly connected to the reference voltage; and
      a damping circuit comprising at least one capacitor.

2. The low pass filter of claim 1 wherein the damping circuit of the common mode filter comprises three capacitors and a resistor.

3. The low pass filter of claim 1 wherein the at least one inductor comprises at least one nanocrystalline common mode inductor.

4. The low pass filter of claim 1 wherein the low pass filter filters out noise signals having frequencies of 150 kiloHertz and above.

5. The low pass filter of claim 1 comprising an input, an output, and a signal line between the input and the output, wherein the pulldown resistor is connected at the input of the low pass filter between the signal line and the reference voltage.

6. A low pass filter comprising:
   an input;
   an output;
   a signal line between the input and the output;
   a pulldown resistor between the signal line and a reference voltage;
   a differential mode filter in the signal line between the input and the output; and
   a common mode filter connected in series with the differential mode filter in the signal line between the input and the output, the common mode filter comprising:
      at least one inductor connected in the signal line;
      at least one capacitor directly connected between the signal line and the reference voltage; and
      a damping circuit connected between the signal line and the reference voltage, the damping circuit comprising at least one capacitor.

7. The low pass filter of claim 6 wherein the signal line between the input and the output comprises first, second and third signal lines.

8. The low pass filter of claim 7 wherein the damping circuit of the common mode filter comprises three capacitors and a resistor.

9. The low pass filter of claim 7 wherein the damping circuit of the common mode filter comprises:
   a first capacitor connected between the first signal line and a node;
   a second capacitor connected between the second signal line and the node;
   a third capacitor connected between the third signal line and the node; and
   a resistor connected between the node and the reference voltage.

10. The low pass filter of claim 9 wherein the first, second and third capacitors weight no greater than about 0.2 pounds (0.09 kilograms) combined.

11. The low pass filter of claim 7 wherein the at least one inductor of the common mode filter comprises:
    a first inductor connected in the first signal line;
    a second inductor connected in the second signal line; and
    a third inductor connected in the third signal line.

12. The low pass filter of claim 7 wherein the at least one capacitor of the common mode filter comprises:
    a first capacitor directly connected between the first signal line and the reference voltage;
    a second capacitor directly connected between the second signal line and the reference voltage; and
    a third capacitor directly connected between the third signal line and the reference voltage.

13. The low pass filter of claim 12 wherein the first, second and third capacitors each include two common mode capacitors connected in series.

14. The low pass filter of claim 7, wherein the differential mode filter comprises:
    a first inductor connected in the first signal line;
    a second inductor connected in the second signal line;
    a third inductor connected in the third signal line;
    a first capacitor connected between the first and second signal lines;
    a second capacitor connected between the second and third signal lines; and
    a third capacitor connected between the first and third signal lines.

15. The low pass filter of claim 6 wherein the common mode filter filters out noise signals having frequencies of 150 kiloHertz and above.

16. The low pass filter of claim 6 wherein the common mode filter exhibits no impedance to signals having a frequency of 1450 Hertz and lower.

17. The low pass filter of claim 6 wherein the pulldown resistor is connected at the input of the low pass filter between the signal line and the reference voltage.

* * * * *